United States Patent [19]
Fukushima

[11] Patent Number: 5,392,301
[45] Date of Patent: Feb. 21, 1995

[54] PROGRAMMABLE READ ONLY MEMORY DEVICE HAVING TEST TOOL FOR ERROR CHECKING AND CORRECTION CIRCUIT

[75] Inventor: Kiyoshi Fukushima, Kumamoto, Japan

[73] Assignee: NEC Corporation, Tokyo, Japan

[21] Appl. No.: 858,596

[22] Filed: Mar. 27, 1992

[30] Foreign Application Priority Data

Mar. 27, 1991 [JP] Japan .................. 3-062252

[51] Int. Cl.[6] .......................................... G06F 11/10
[52] U.S. Cl. .................... 371/40.1; 371/37.1
[58] Field of Search ............. 371/40.1, 37.1, 3

[56] References Cited

U.S. PATENT DOCUMENTS 4,878,220  10/1989  Hashimoto ............................. 371/3
5,056,089  10/1991  Furuta et al. ........................ 371/3

FOREIGN PATENT DOCUMENTS 0268289  5/1988  European Pat. Off. .
2633767 10/1988  France .

Primary Examiner—Roy N. Envall, Jr.
Assistant Examiner—Emmanuel Moise
Attorney, Agent, or Firm—Sughrue, Mion, Zinn, Macpeak & Seas

[57] ABSTRACT

A programmable read only memory device comprises a first memory unit for data codes, a second memory unit for parity codes, and an error checking and correction unit for retrieving an original data code from the data code and the associated parity code, wherein a test data code and an improper or proper parity code is supplied from a test data register to the error checking and correction unit so that not only the data checking circuit but also the data correction circuit are examined to see if or not any trouble takes place therein.

2 Claims, 4 Drawing Sheets

PROGRAMMABLE READ ONLY MEMORY DEVICE HAVING TEST TOOL FOR ERROR CHECKING AND CORRECTION CIRCUIT

FIELD OF THE INVENTION

This invention relates to a programmable read only memory device and, more particularly, to a test tool or a test circuit for an error checking and correction circuit incorporated in the programmable read only memory device.

DESCRIPTION OF THE RELATED ART

A programmable read only memory device is expected to be highly reliable for some high precision electronic systems, and an error checking and correction circuit enhances the reliability of data information read out from the programmable read only memory device. A typical example of the programmable read only memory device with the error checking and correction circuit is illustrated in FIG. 1, and comprises a programmable read only memory unit 1 for storing 32-bit data codes, a programmable read only memory unit 2 for storing 6-bit parity codes, an error checking and correction circuit 3 coupled with the programmable read only memory units 1 and 2, and a data selector 4 responsive to the least significant bit AD0 of an address signal for sequentially transferring a data code from the error checking and correction circuit 3 to a 16-bit bit data bus system 5. An address bus system 6 propagates the address signal to the programmable read only memory units 1 and 2, and supplies the least significant bit AD0 to the data selector 4. A string of data bits is supplied through a data bit line 7a to the programmable read only memory unit 1, and a parity bit line 7b propagates a string of parity bits to the programmable read only memory unit 2.

The error checking and correction circuit 3 is implemented by combination of a data checking circuit 3a and a data correction circuit 3b. The data checking circuit 3a checks a 32-bit data code and an associated 6-bit parity code to see whether or not an error bit is incorporated in the 32-bit data code, and produces an instruction signal indicative of the error. The data correction circuit 3b is responsive to the instruction signal supplied from the data checking circuit 3a, and retrieves the original 32-bit data code. However, if any error bit is incorporated in the 32-bit data code read out from the programmable read only memory device 1, the 32-bit data code is directly transferred to the data selector 4.

In order to test the error checking and correction circuit 3, a parity code is generated on the basis of a data code, and the data code and the associated parity code are written into respective addresses of the programmable read only memory units 1 and 2 indicated by the address signal on the address bus system 6. Then, the address signal indicative of the address assigned to the data code and the associated parity code is supplied from the address bus system 6 to the programmable read only memory units 1 and 2, and the data code and the associated parity code are respectively read out from the programmable read only memory units 1 and 2. The data code and the parity code are transferred to the data checking circuit 3a, and the data checking circuit 3a checks the data code and the associated parity code to see if or not an error bit is incorporated in the data code. Since a parity code is automatically generated from a data code by a parity circuit (not shown), the parity code is proper to the data code at all times. Therefore, the data checking circuit 3a decides the data code to be correct in so far as the programmable read only memory units 1 and 2 do not have any trouble. When the data code is correct, the data code is directly transferred to the data selector 4 without any correction, and is, thereafter, read out through the 16-bit data bus system 5 to the outside thereof. The data code is checked by an examiner to see if or not any trouble takes place in the error checking and correction circuit 3. If the read-out data code is matched with the original data code, the examiner judges that the error checking and correction circuit 3 is excellent. If, on the other hand, the data checking circuit 3a has a trouble, the data code is mistakenly judged to have an error bit, and the data correction circuit 3b corrects the error bit. Therefore, the data code read out through the 16-bit data bus system is different from the original data code, and the examiner diagnose the error checking and correction circuit 3 as defect.

However, a problem is encountered in the prior art programmable read only memory device in that any trouble in the data correction circuit 3b is hardly detectable in so far as the data checking circuit is excellent. This is because of the fact that a correct data code is directly transferred from the data checking circuit 3a to the data selector 4. If the data checking circuit 3a is excellent and the data correction circuit 3b is defective, the examiner can not find the trouble because the read-out data code is matched with the original data code.

SUMMARY OF THE INVENTION

It is therefore an important object of the present invention to provide a programmable read only memory device which allows any trouble in an error checking and correction circuit to be detectable.

To accomplish the object, the present invention proposes to directly supply a data code and an improper parity code to an error checking and correction circuit.

In accordance with the present invention, there is provided a programmable read only memory device comprising a) a first programmable read only memory unit having a plurality of addressable memory locations for respectively storing a plurality of data codes, b) a second programmable read only memory unit having a plurality of addressable memory locations respectively associated with the addressable memory locations of the first programmable read only memory unit for respectively storing a plurality of parity codes respectively produced from the data codes, c) an error checking and correction circuit having a data checking unit operative to check a data code and an associated parity code to see if or not at least one error bit is incorporated in the data code, and a data correction unit operative to correct the at least one error bit for retrieving the data code, the data code being read out to the outside of the programmable read only memory device, d) a rewritable data storage communicable with an external source outside of the programmable read only memory device, and storing a data code used for a diagnosis and a parity code improperly or properly produced on the basis of the data code used in the diagnosis, and e) a selector having first, second and third input ports respectively coupled with the first programmable read only memory unit, the second programmable read only memory unit and the rewritable data storage, and an output port coupled with the data checking unit, the selector being responsive to a selecting signal supplied from the outside of the programmable read only memory device for coupling the first and second input ports or the third input port with the output port.

BRIEF DESCRIPTION OF THE DRAWINGS

The feature and advantages of the programmable read only memory device according to the present invention will be more clearly understood from the following description taken in conjunction with the accompanying drawings in which.

DESCRIPTION OF THE PREFERRED EMBODIMENTS

First Embodiment

Figure 1:
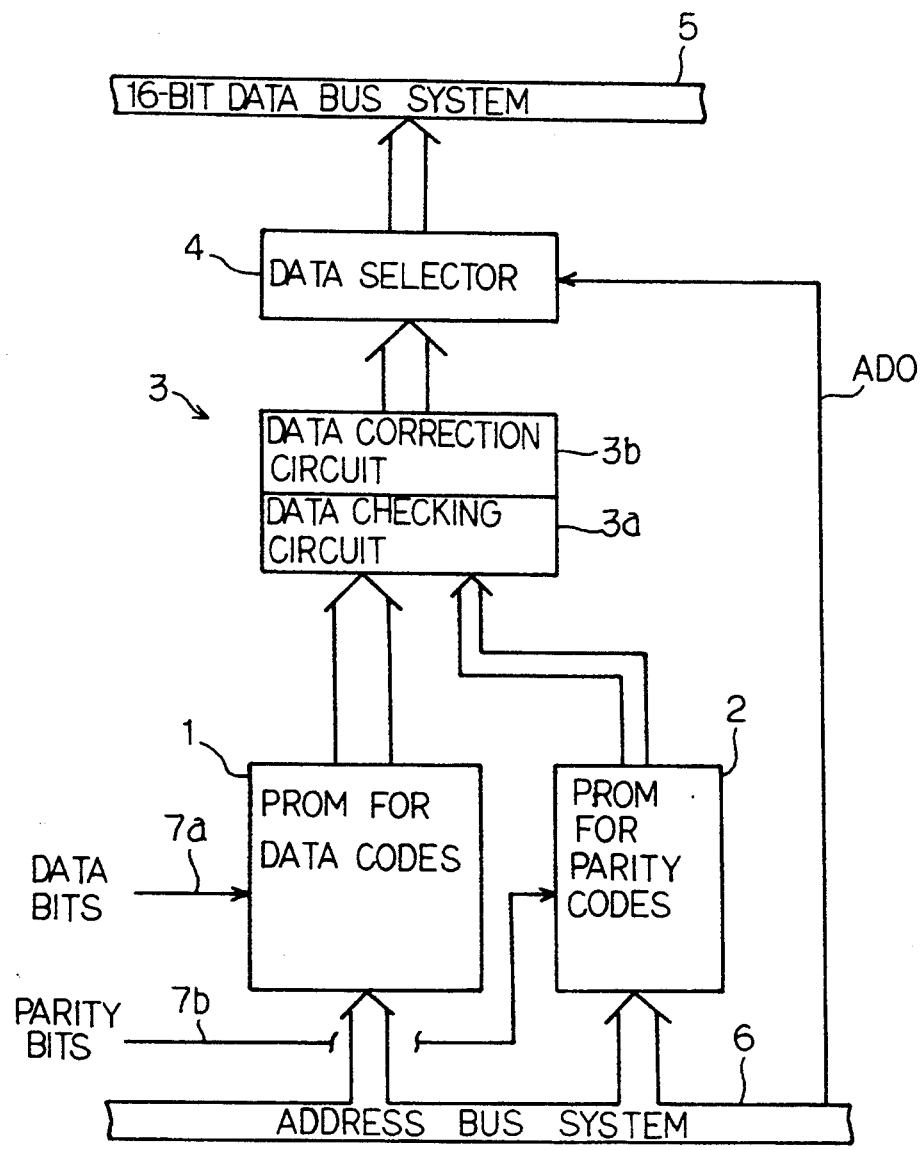
FIG. 1 is a block diagram showing the circuit arrangement of the prior art programmable read only memory device.
Figure 2:
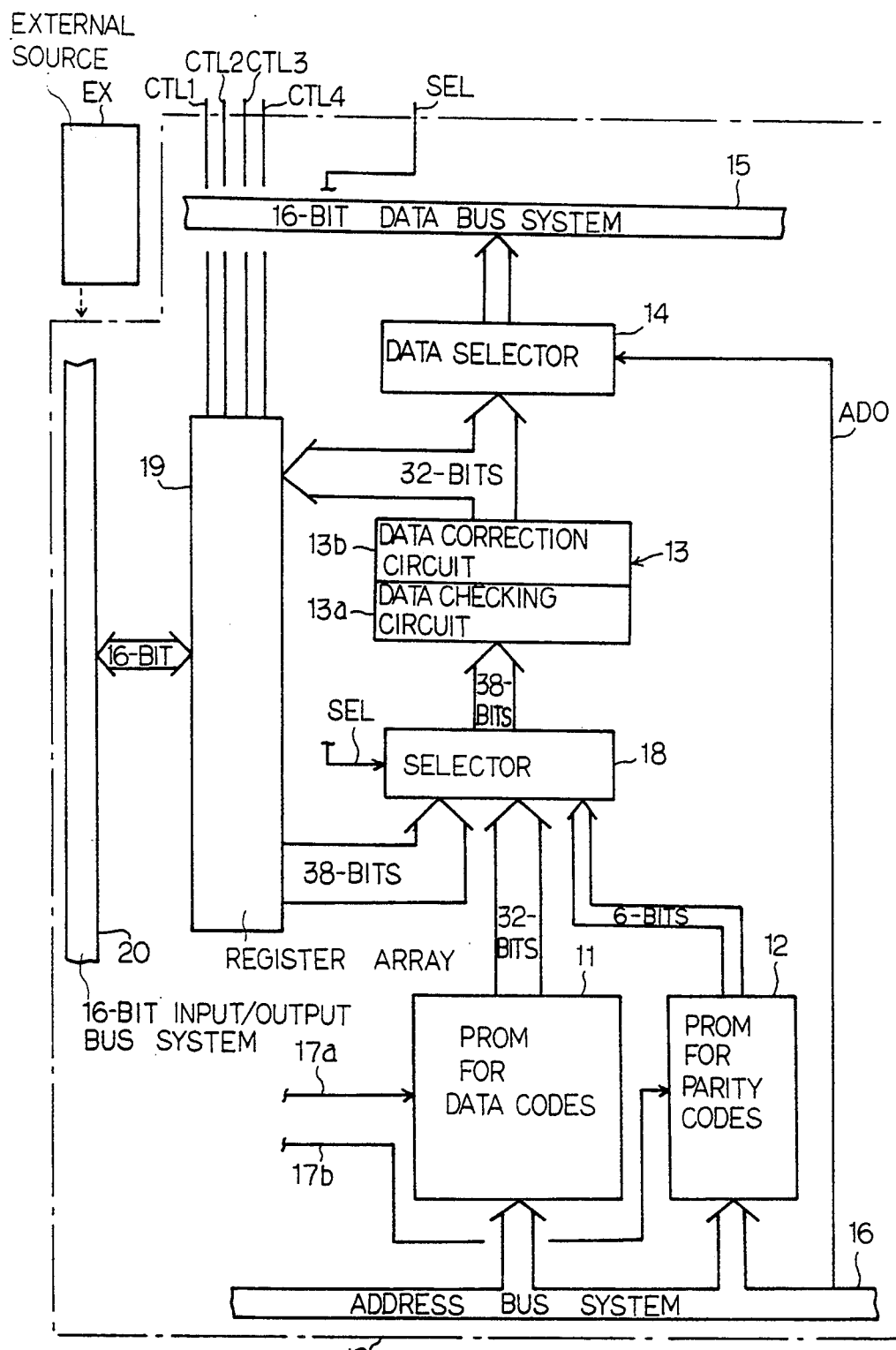
FIG. 2 is a block diagram showing the circuit arrangement of a programmable read only memory device according to the present invention.

Referring to FIG. 2 of the drawings, a programmable read only memory device 10 embodying the present invention comprises a first programmable read only memory unit 11 for storing 32-bit data codes, a second programmable read only memory unit 12 for storing 6-bit parity codes, an error checking and correction circuit 13 for retrieving an original data code, if necessary, and a data selector 14 coupled between the error checking and correction circuit 13 and a 16-bit data bus system 15 as similar to the prior art programmable read only memory. An address bus system 16 supplies an address signal to both programmable read only memory units 11 and 12, and the least significant bit AD0 of the address signal steers the data selector 14 for sequentially transferring a 32-bit data code to the 16-bit data bus system 15. The programmable read only memory unit 11 has a plurality of addressable memory locations each storing a 32-bit data code, and the programmable read only memory unit 12 also has a plurality of addressable memory locations each storing a 6-bit parity code. The addressable memory locations of the programmable read only memory unit 11 are respectively associated with the addressable memory locations of the other programmable read only memory unit 12, and a string of data bits and a string of parity bits are respectively written from data lines 17a and 17b into the programmable read only memory units 11 and 12 in accordance with an address signal on the address bus system 16. Though not shown in the drawings, a parity generator is associated therewith, and generates a parity code for a given data code. The error checking and correction circuit 13 is constituted by a data checking circuit 13a and a data correction circuit 13b, and the data checking circuit 13a and the data correction circuit 13b behave as similar to those of the prior art programmable read only memory device.

The programmable read only memory device 10 implementing the first embodiment further comprises a selector 18, and a register array 19 coupled with a 16-bit input/output bus system 20. The register array 19 is bi-directional. Namely, the register array 19 stores a 32-bit test data code and a 6-bit parity code proper or improper to the 32-bit test data code both supplied from an external source EX through the 16-bit input/output bus system 20, and further stores the 32-bit test data code which has been already subjected to the error checking and correction at the error checking and correction circuit 13. The selector has three input ports. One of the three input ports is coupled with the register array 19, and the 32-bit test data code and the associated 6-bit parity code are supplied in parallel. Another of the three input ports is coupled with the programmable read only memory unit 11, and a read-out data code is supplied. Yet another of the three input ports is coupled with the programmable read only memory unit 12, and a read-out parity code is supplied. The selector 18 is responsive to a selecting signal supplied from the outside of the programmable read only memory device 10, and the selector 18 selectively couples the three input ports to an output port thereof. Then, the 32-bit test data code and the associated parity code or the read-out data code and the associated read-out parity code are transferred to the error checking and correction circuit 13 depending upon the selecting signal SEL.

Figure 3:
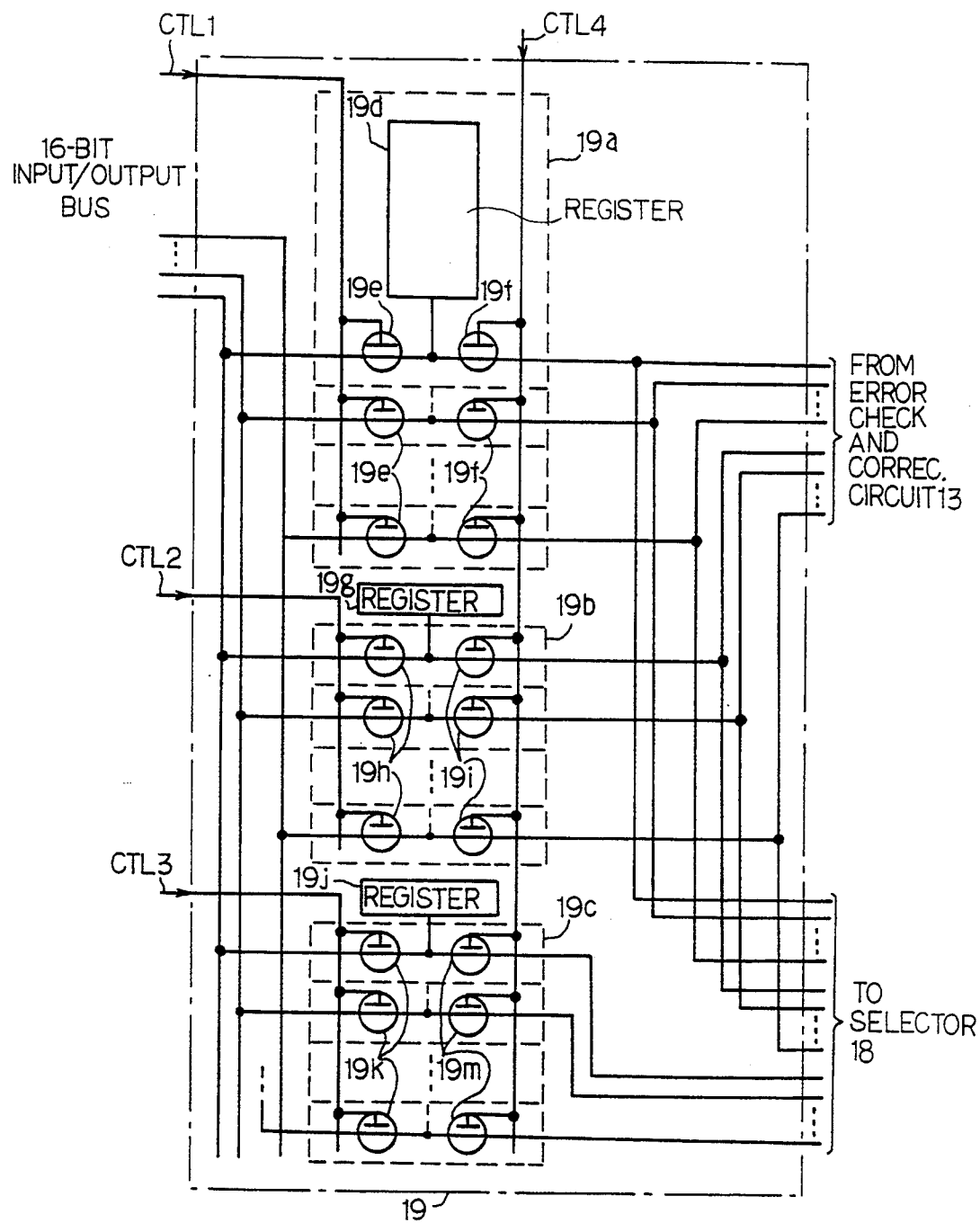
FIG. 3 is a circuit diagram showing a register unit incorporated in the programmable read only memory device shown in FIG. 2.

FIG. 3 shows the arrangement of the register array 19, and the register array 19 is responsive to four control signals CTL1, CTL2, CTL3 and CTL4. In detail, the register array 19 comprises 38 first, second and third register sub-arrays 19a, 19b and 19c. The first register sub-array 19a is implemented by sixteen registers 19d each accompanied with a pair of transfer transistors 19e and 19f, and the second register sub-array 19b is also implemented by sixteen registers 19g each accompanied with a pair of transfer transistors 19e and 19f. However, the third register sub-array 19c is implemented by only six registers 19j each accompanied with a pair of transfer transistors 19k and 19m. The transfer transistors 19e are coupled between the 16-bit input/output bus system 20 and the associated registers 19d, and is gated by the first control signal CTL1. The transfer transistors 19f are coupled between the associated registers 19d and the selector 18 as well as the error checking and correction circuit 13, and are responsive to the fourth control signal CTL4. The transfer transistors 19h are coupled between the 16-bit input/output bus 20 and the associated registers 19g in parallel to the transfer transistors 19e, and are responsive to the second control signal CTL2. The transfer transistors 19i are coupled between the associated registers 19j and the selector 18 as well as the error checking and correction circuit 13, and are concurrently gated with the fourth control signal CTL4. The transfer transistors 19k are selectively coupled between the component signal lines of the 16-bit input/output bus system 20 and the associated registers 19j, and are responsive to the third control signal CTL3. The transfer transistors 19m are coupled between the associated registers 19j and the selector 18 only, and are also concurrently gated with the fourth control signal CTL4. Therefore, data bits on the 16-bit input/output bus system 20 pass through one of the transfer transistor arrays 19e, 19h or 19k depending upon the first to third control signals CTL1 to CTL3, and are selectively written into one of the register arrays 19d, 19g or 19j. Thus, a 32-bit test data code is sequentially stored in the first and second register sub-arrays 19a and 19b, and the associated parity code is written into the third register sub-array 19c. After the memorization, the test data code and the associated parity code are read out from the register arrays 19d and 19g through the transfer transistor arrays 19f and 19i, and are supplied to the selector 18.

On the other hand, the test data from the error checking and correction circuit 13 passes through the transfer transistor arrays 19f and 19i, and is written into the register arrays 19d and 19g. After memorization, the test data code are sequentially transferred to the 16-bit input/output bus system 20 with the first and second control signals CTL and CTL2.

Description is hereinbelow made on circuit behavior of the programmable read only memory device 10. The programmable read only memory device 10 implementing the first embodiment selectively enters a standard mode of operation for serving as a data storage of data codes and a test mode for the error checking and correction circuit 13. In the standard mode of operation, the selecting signal SEL is indicative of interconnection between the output port and two of the three input ports assigned to the data codes and the parity codes, and the data codes and the associated parity codes are sequentially read out from the programmable read only memory units 11 and 12 to the error checking and correction circuit 13.

If the programmable read only memory device 10 enters the test mode of operation, the selecting signal SEL causes the selector 18 to couple the input port associated with register array 19 with the output port and, accordingly, the error checking and correction circuit 13. The external source EX supplies sixteen data bits of a test data code to the 16-bit input/output bus system 20, and the first control signal CTL1 is shifted to an active level. Then, the sixteen data bits are transferred to the registers 19d, and are stored therein. Subsequently, the other sixteen data bits of the test data code are supplied from the external source EX to the 16-bit input/output bus system 20, and only the second control signal CTL2 is shifted to the active level. The other sixteen data bits are, then, stored in the registers 19g. Thereafter, the external source EX supplies a parity code properly produced on the basis of the test data code to the 16-bit input/output bus system 20, and only the third control signal CTL3 is shifted to the active level so that the proper parity code is stored in the registers 19j. When the test data code and the proper parity code are stored in the register array 19, the fourth control signal CTL4 is shifted to the active level, and the test data code and the proper parity code are supplied from the register array 19 through the selector 18 to the error checking and correction circuit 13. In the error checking and correction circuit 13, the data checking circuit 13a firstly checks the test data code and the proper parity code to see if or not any error data bit is incorporated in the test data code. Since the parity code is proper to the test data code, the data checking circuit 13a directly supplies the test data code to the register array 19 without any data correction. Since the fourth control signal CTL4 has been shifted to the active level, the test data code is stored in the registers 19d and 19g. With the first and second control signals CTL1 and CTL2, the test data code is sequentially read out from the register array 19 to the outside, and is examined by an examiner. If the data checking circuit 13a is excellent, the test data code is matched with the test data subjected to the error checking and correction. However, if the data checking circuit 13a is defective, the data checking circuit 13a allows the data correction circuit 13b to operate on the test data code, and the test data code subjected to the data correction is different from the original test data.

Subsequently, the external source EX supplies sixteen data bits of a test data code to the 16-bit input/output bus system 20, and only the first control signal CTL1 is shifted to an active level. Then, the sixteen data bits are transferred to the registers 19d, and are stored therein. The remaining sixteen data bits of the test data code are supplied from the external source EX to the 16-bit input/output bus system 20, and only the second control signal CTL2 is shifted to the active level. The remaining sixteen data bits are, then, stored in the registers 19g. Thereafter, the external source EX supplies a parity code improperly produced on the basis of the test data code to the 16-bit input/output bus system 20, and only the third control signal CTL3 is shifted to the active level so that the improper parity code is stored in the registers 19j. When the test data code and the improper parity code are stored in the register array 19, only the fourth control signal CTL4 is shifted to the active level, and the test data code and the improper parity code are supplied from the register array 19 through the selector 18 to the error checking and correction circuit 13. In the error checking and correction circuit 13, the data checking circuit 13a firstly checks the test data code and the improper parity code to see if or not any error data bit is incorporated in the test data code. Since the parity code is improper to the test data code, the data checking circuit 13a instructs the data correction circuit 13b to correct an error bit incorporated in the test data code. After the correction, the data correction circuit 13b supplies the corrected test data code to the register array 19. Since the fourth control signal CTL4 has been shifted to the active level, the corrected test data code is stored in the registers 19d and 19g. With the first and second control signals CTL1 and CTL2, the corrected test data code is sequentially read out from the register array 19 to the outside, and is examined by an examiner. If the data correction circuit 13b is excellent, the corrected test data code is proper to the parity code improper to the original test data code. However, if the data correction circuit 13b is defective, the test data code is still improper to the parity code, and the examiner finds the data correction circuit 13b defective.

Second Embodiment

Figure 4:
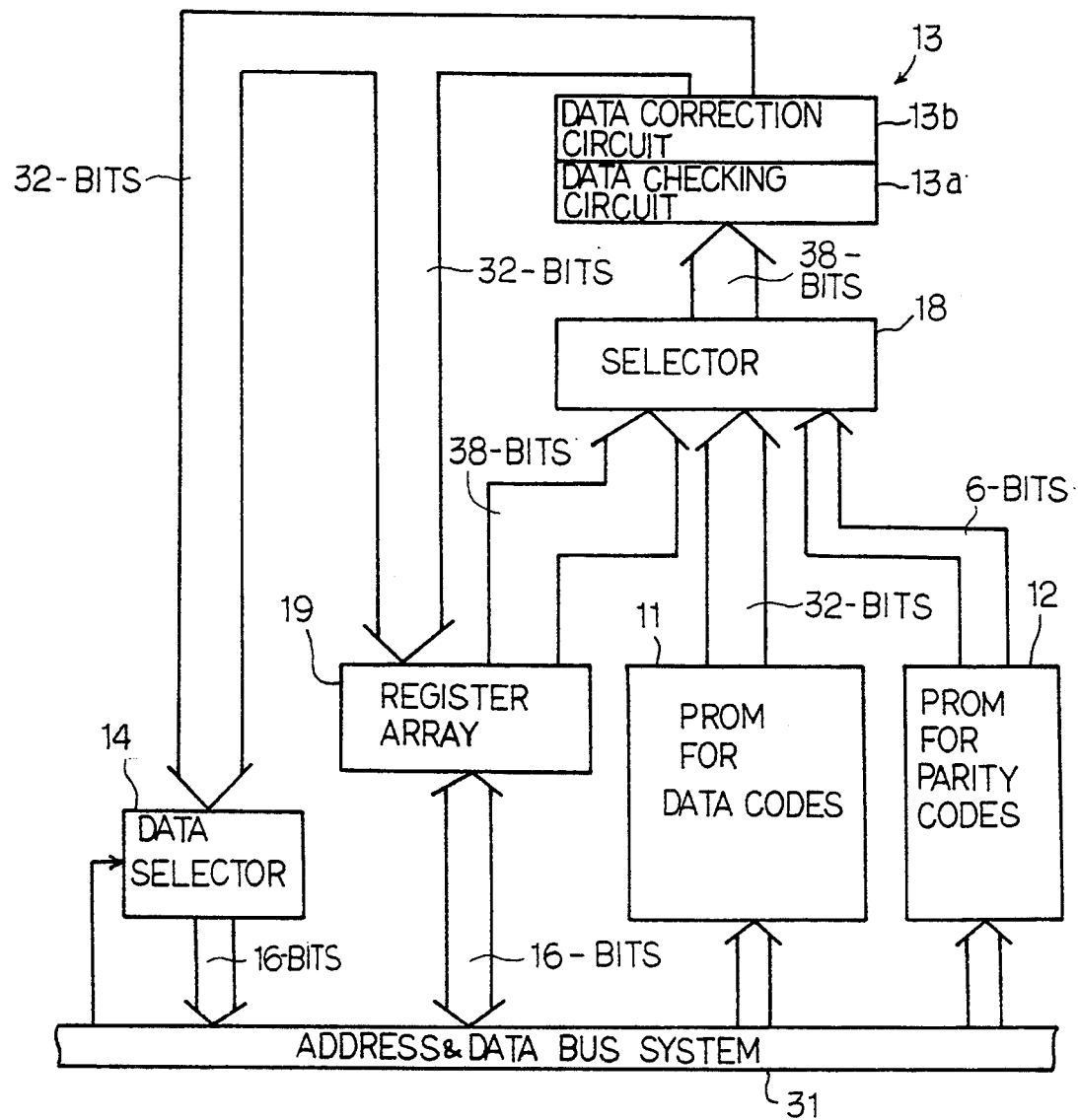
FIG. 4 is a block diagram showing the circuit arrangement of another programmable read only memory device according to the present invention.

Turning to FIG. 4 of the drawings, another programmable read only memory device embodying the present invention is illustrated. The programmable read only memory device implementing the second embodiment is similar in circuit arrangement to the first embodiment except for an address and data bus system, and, for this reason, circuit components are labeled with the same references designating the corresponding components of the first embodiment without any detailed description. The register array 19 of the second embodiment is similar in circuit arrangement to the register array shown in FIG. 3. Since the address and data bus system 31 is shared between the standard mode and the test mode, the arrangement of the programmable read only memory device is relatively simple rather than the first embodiment.

As will be appreciated from the foregoing description, the error checking and correction circuit 13 of the programmable read only memory device according to the present invention is exactly diagnosed in the test mode by virtue of the test data code and the proper or improper parity code stored in the register array 19.

Although particular embodiments of the present invention have been shown and described, it will be obvious to those skilled in the art that various changes and modifications may be made without departing from the spirit and scope of the present invention. For example, the programmable read only memory device may be fabricated on a single semiconductor chip, or be a built-in programmable read only memory incorporated in, for example, a microprocessor.

What is claimed is:

1. A programmable read only memory device selectively entering into a standard mode for serving as a data storage and a test mode for an error checking and correction circuit, comprising:
   a) a first programmable read only memory unit having a plurality of addressable memory locations for respectively storing a plurality of data codes;
   b) a second programmable read only memory unit having a plurality of addressable memory locations respectively associated with said addressable memory locations of said first programmable read only memory unit for respectively storing a plurality of parity codes respectively produced from said data codes;
   c) said error checking and correction circuit having a data checking unit operative to check a data code and an associated parity code to determine whether at least one error bit is incorporated in said data code, and a data correction unit operative to correct said at least one error bit for retrieving said data code, said error checking and correction circuit supplying a data code to a data bus system in said standard mode and through a rewritable data storage to an input and output bus system in said test mode, a data selector being coupled between said error checking and correction circuit and said data bus system, data bits of each data code being larger in number than component signal lines of said data bus system and than component signal lines of said input and output bus system;
   d) said rewritable data storage communicable with an external source outside of said programmable read only memory device, and storing a data code used for a diagnosis and a parity code properly or improperly produced on the basis of said associated data code used in the diagnosis; and
   e) said selector having first, second and third input ports respectively coupled with said first programmable read only memory unit, said second programmable read only memory unit and said rewritable data storage, and an output port coupled with said data checking unit, said selector being responsive to a selecting signal supplied from the outside of said programmable read only memory device for coupling said first and second input ports with said output port in said standard mode and said third input port with said output port in said test mode, said rewritable data storage comprising a first register sub-array for data bits of said data code coupled through a first transfer gate array with all of the component signal lines of said input and output bus system and through a second transfer gate array with said third input port and an output port of said error checking and correction circuit, a second register sub-array for remaining data bits of said data code coupled through a third transfer gate array with all of the component signal lines of said input and output bus system and through a fourth transfer gate array with said third input port and the output port of said error checking and correction circuit, and a third register sub-array for said proper or improper parity code coupled through a fifth transfer gate array with parts of said component signal lines of said input and output bus system and through a sixth transfer gate array with said third input port, said first, third and fifth transfer gate arrays being selectively gated by first, second and third control signals, said second, fourth and sixth transfer gate arrays being concurrently gated by a fourth control signal.

2. A programmable read only memory device selectively entering into a standard mode for serving as a data storage and a test mode for an error checking and correction circuit, comprising:
   a) a first programmable read only memory unit having a plurality of addressable memory locations for respectively storing a plurality of data codes;
   b) a second programmable read only memory unit having a plurality of addressable memory locations respectively associated with said addressable memory locations of said first programmable read only memory unit for respectively storing a plurality of parity codes respectively produced from said data codes;
   c) said error checking and correction circuit having a data checking unit operative to check a data code and an associated parity code to determine whether at least one error bit is incorporated in said data code, and a data correction unit operative to correct said at least one error bit for retrieving said data code, said error checking and correction circuit supplying a data code to a shared bus system in said standard mode and said test mode, a data selector being coupled between said error checking and correction circuit and said shared bus system, data bits of each data code being larger in number than component signal lines of said shared bus system;
   d) a rewritable data storage communicable with an external source outside of said programmable read only memory device, and storing a data code used for a diagnosis and a parity code properly or improperly produced on the basis of said associated data code used in the diagnosis; and
   e) a selector having first, second and third input ports respectively coupled with said first programmable read only memory unit, said second programmable read only memory unit and said rewritable data storage, and an output port coupled with said data checking unit, said selector being responsive to a selecting signal supplied from the outside of said programmable read only memory device for coupling said first and second input ports with said output port in said standard mode and said third input port with said output port in said test mode, said rewritable data storage comprising a first register sub-array for data bits of said data code coupled through a first transfer gate array with all of the component signal lines of said input and output bus system and through a second transfer gate array with said third input port and an output port of said error checking and correction circuit, a second register sub-array for remaining data bits of said data code coupled through a third transfer gate array with all of the component signal lines of said input and output bus system and through a fourth transfer gate array with said third input port and the output port of said error checking and correction circuit, and a third register sub-array for said proper or improper parity code coupled through a fifth transfer gate array with parts of said component signal lines of said input and output bus system and through a sixth transfer gate array with said third input port, said first, third and fifth transfer gate arrays being selectively gated by first, second and third control signals, said second, fourth and sixth transfer gate arrays being concurrently gated by a fourth control signal.

* * * * *